United States Patent [19]

Kaplo et al.

[11] Patent Number: 5,045,635

[45] Date of Patent: Sep. 3, 1991

[54] CONDUCTIVE GASKET WITH FLAME AND ABRASION RESISTANT CONDUCTIVE COATING

[75] Inventors: Joseph J. Kaplo, Pittsford; William Hoge, Palmyra; Craig Lund, Lima, all of N.Y.

[73] Assignee: Schlegel Corporation, Rochester, N.Y.

[21] Appl. No.: 367,210

[22] Filed: Jun. 16, 1989

[51] Int. Cl.⁵ .......................... H05K 9/00; H01S 4/00
[52] U.S. Cl. ............................ 174/35 GC; 174/35 R; 219/10.55 D; 29/592.1
[58] Field of Search .......... 174/35 R, 35 MS, 35 GC; 361/424; 219/10.55 D, 10.55 R; 29/592.1

[56]     References Cited

U.S. PATENT DOCUMENTS

| | | | |
|---|---|---|---|
| 2,462,334 | 2/1949 | Pierson | 174/35 GC |
| 3,583,930 | 6/1971 | Ehrreich et al. | 252/514 |
| 3,609,104 | 9/1971 | Ehrreich | 252/511 |
| 4,399,317 | 8/1983 | Van Dyk | 174/35 GC |
| 4,447,492 | 5/1984 | McKaveney | 428/328 |
| 4,857,668 | 8/1989 | Buonanno | 174/35 GC |

*Primary Examiner*—Leo P. Picard
*Assistant Examiner*—Bot L. Ledynh
*Attorney, Agent, or Firm*—Eckert, Seamans, Cherin & Mellott

[57]          ABSTRACT

A conductive gasket for sealing facing flange plates against passage of electromagnetic and environmental effets has a conductive sheath, for example supported on a molded, resilient foam core, and structure for affixing the seal to conductive elements to be sealed. A conductive coating having suspended conductive particles in a nonreactive binder is applied externally to the sheath in order to reduce galvanic corrosion by isolating the dissimilar metals contained in the sealed elements and in the conductive sheath. The sheath coating is preferably applied as a colloidal suspension of carbon particles, to the entire outer surface of a metal plated sheath and provides a low resistance, environmentally isolated junction between the sheath and the elements to be sealed, excluding environmental electrolytes, while improving abrasion resistance and flame retardant attributes of the seal.

12 Claims, 2 Drawing Sheets

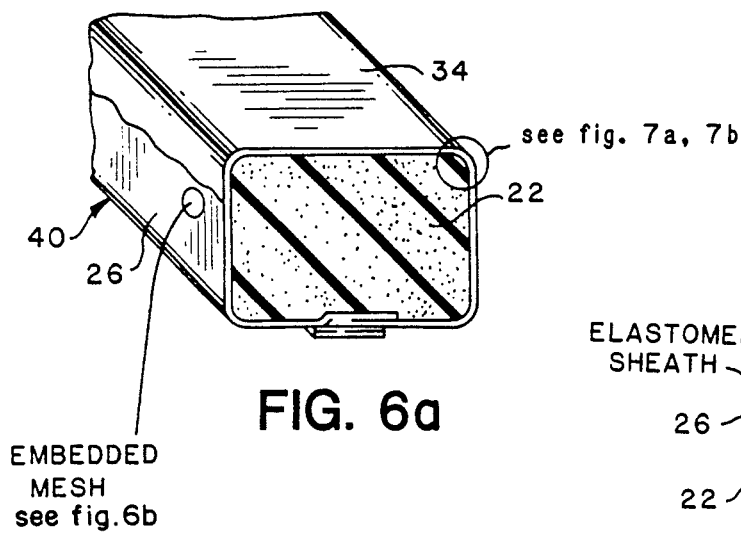
FIG. 6a
EMBEDDED MESH see fig.6b
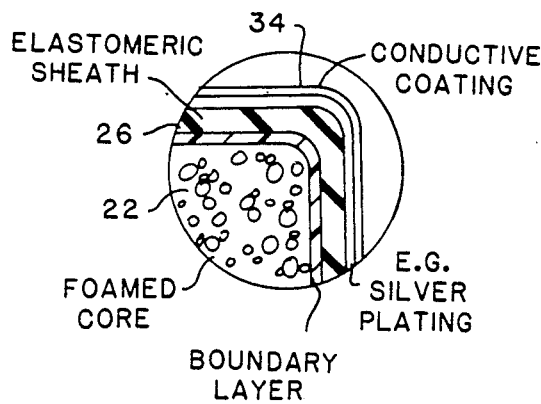
FIG. 7a
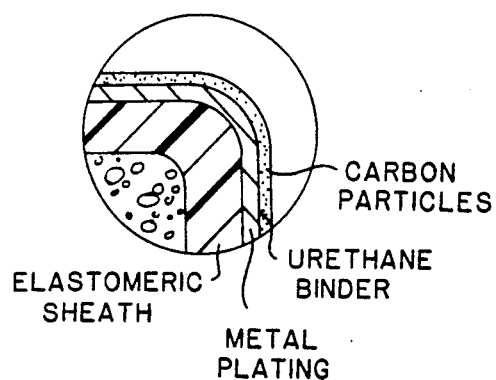
FIG. 7b
FIG. 6b

CONDUCTIVE GASKET WITH FLAME AND ABRASION RESISTANT CONDUCTIVE COATING

BACKGROUND OF THE INVENTION

1. Field of the Invention

This invention relates to multi-purpose conductive gaskets for excluding electromagnetic interference (EMI), radio frequency interference (RFI) and also blocking environmental effects such as noise and moisture from the ambient atmosphere. More particularly, the invention concerns a conductive gasket or seal wherein a conductive sheath surrounding a resilient core is coated with a coating formed of a suspension of conductive particles. 2. Prior Art Conductive seals and gaskets are known in a number of variations. Typically, the gasket bridges across metallic surfaces of adjacent or abutting conductive structures, for example at a closure of a cabinet, at a window or door, etc. The adjacent or abutting structures are to be continuously sealed to one another hermetically, to exclude air and moisture at least at low pressure differential, and also electrically, to exclude electromagnetic and radio frequency interference from affecting elements within the enclosure. Alternatively, the seal or gasket may be intended to prevent environmental or electromagnetic influences from escaping from an enclosure.

U.S. patent application Ser. No. 181,834, filed Apr. 15, 1988 (now U.S. Pat. No. 4,857,668) discloses a multi-function gasket of this general type. The gasket has a continuous, molded, resilient core, which is preferably fire-resistant foamed polyurethane. A flexible, electrically conductive sheath surrounds the foam core and is preferably bonded to a boundary layer around the outside of the core. The sheath can incorporate a metal mesh or foil, but preferably the sheath is resinous, for example Rip-Stop Nylon, and has a thin coating of metal plated thereon, for example silver. Alternative means are provided for mounting the gasket such that the sealed elements, such as electrically conductive doors, access panels and the like, are bridged across electrically and hermetically. Seals of this type are marketed by the Schlegel Corporation, Rochester, New York.

Seals and gaskets of the foregoing description might be appropriate for use in controlled environments where the temperature and humidity are maintained, and also in uncontrolled environments, where temperature and humidity vary. These seals are further employed in highly demanding applications such as marine use, wherein the seals are exposed to salt water, and even to space environments, wherein the seal and sealed elements are exposed to vacuum and high radiation.

Over the range of uses, there are important considerations which affect the choice of component materials for the sealed elements (hereinafter "flange plates") and for the gaskets or seals. Structural metals to be used in housings and cabinet structures, for example, may include various steels, possibly in the form of corrosion resistant alloys, aluminum, copper, magnesium, zinc and the like. It is also possible to alloy or coat metals such as steel to improve resistance to oxidation and corrosion. However, the use of dissimilar metals in conductive contact with one another inherently deteriorates at least one of the dissimilar metals when exposed to an electrolyte, due to galvanic action. When exposed to an electrolyte, (a salt solution having free ions) a migration of electrons occurs, which affects the dissimilar metals unequally due to their different electron valence conditions. The migration of electrons causes accelerated oxidation in the less noble one of the dissimilar metals. The conditions needed for galvanic corrosion are simply the dissimilar metals and the electrolyte in contact with them.

When a conductive gasket for excluding electromagnetic interference is placed between two metal flange plates, dissimilar metals are quite likely to be employed and must be placed in contact. The use of dissimilar metals is expected because desirable attributes in flange plates (e.g., strength and rigidity) are not the same as those in gaskets (e.g., flexibility and maximum electrical conductivity). It is also frequently the case that the area of the seal is exposed to an electrolyte. For cabinet closures, doors and other openable seals, condensation occurs at the junction between environments of different temperatures and humidities, separated by the seal. Corrosion can be expected.

Galvanic corrosion causes a physical deterioration of the seal resulting in deterioration of both electrical and environmental sealing performance. The sealed flange plates develop gaps relative to the gasket as a result of corrosion-induced unevenness of the flange plate surface. The extent of electrical connection across the seal deteriorates due to the fact that metal oxides as a rule are relatively less conductive than the corresponding elemental metal and produce increased electrical resistance between the flange plates or the like to be sealed. The increased electrical resistance reduces the seal effectiveness as does the physical displacement of the conductive parts.

The basic objective of shielding against electromagnetic interference requires blocking passage of electromagnetic waves at the seal or gasket. Both electric and magnetic fields are involved and interact. If an enclosure is surrounded by a theoretically perfect conductor, an incident electric field will be fully reflected because an electric field equal and opposite to the incident electric field is induced in the conductive enclosure. Magnetic fields induce a current in the conductive enclosure, and incident EMI or RFI waves include both electric and magnetic energy. The current induced in the enclosure by the field will vary across the thickness of the conductive enclosure, being greatest at the surface adjacent the incident field. A portion of the electromagnetic wave is reflected at the inner boundary of the enclosure, however, some of the radiation will reach the inside of the enclosure unless the conductive walls are very conductive and very thick.

A gap in the conductive shield produced either by physical spacing or by increased electrical resistance will allow a greater proportion of an incident electromagnetic field to radiate through the shield. Gasket material normally is flexible and has a lower conductivity than the material of the conductive enclosure or shield (i.e., a relatively higher electrical resistance). A highly conductive material is desirable to maintain a low resistance and minimal leakage at the interface between the gasket and the shield-defining flange plates or other elements.

If an air gap exists, the flow of induced current is diverted to those points or areas of the seal and sealed elements which are in contact. A high resistance joint, which may be caused by corrosion of the seal and sealed elements at their face and surfaces behaves in a manner similar to a gap.

In view of the corrosion caused by galvanic action between dissimilar metals, it may be desirable to employ similar metals for the sealed elements and the gasket. It is also appropriate to finish the metal which is expected to corrode, to decrease the incidence of corrosion. A relatively more corrosion-prone metal, for example, magnesium, tin, steel or aluminum, can be coated with relatively more-noble finishes which are less likely to corrode, for example, gold, platinum, silver, nickel, etc. Corrosion resistances thus improve for the overall sealed element. On the other hand, corrosion will be even greater if the seal breaks down or is applied so thinly as to be porous, because dissimilar metals are in contact at the site of an electrolyte. Some finishes, for example, chromate conversion coatings (e.g. Iridite for aluminum) are moderately conductive, and improve corrosion performance. Organic finishes can also be used. Such finishes are not fully effective because they are characterized by increased electrical resistance relative to bare metal, and a corresponding decrease in EMI shielding effectiveness; there is a possibility of corrosion should the finish become deteriorated; and in other respects leave room for improvement.

Conductive sheaths for seals available in the Schlegel product line employ various different metals, as needed for sealing between conductive elements of various descriptions. Most EMI/RFI gaskets are placed between two structural metal flanges, usually of aluminum or steel. A conductive gasket is interspersed, for example, the above-described Schlegel gasket with a conductive sheath of metallized nylon, on a foam core. It is also possible to use a sheath formed of a wire mesh or including metal fibers, for example including Monel or Ferrex. Monel is an alloy of nickel, copper and usually iron and manganese. Ferrex is a copper clad steel. While these materials are preferred for good conductivity, galvanic corrosion can be a serious problem.

Given the use of dissimilar metals, steps must be taken to control corrosion. Even when it is practical to seal flanges with finishes such that a more noble member is at the exposed surface and normally prevents electrolytes in the ambient atmosphere from reaching the less-noble metal, it is still desirable to design the interface properly to exclude moisture, and to cause the seal material to fill all gaps caused by uneven flange shapes, surface irregularities, bowing of the flange plates adjacent fasteners, and the like. Typically, designers of conductive elastomer gaskets will select a sheath material such as silver plated or aluminum filled elastomers, or silver-copper elastomers. The seals are kept clear of sump areas and/or are provided with drainage holes to remove any electrolyte accumulating due to condensation, etc. Dessicants may be employed, and protective paints are preferably applied to flange surfaces approaching the area of the seal. Military standards go so far as to prefer double seals, an external environmental seal being employed in addition to an electromagnetic seal. The outer, non-conductive environmental seal protects the inner, conductive seal from the ingress of electrolyte. (See e.g. Mil-Std-1250; Mil-Std-889; or Mil-Std-454).

According to the present invention, the incidence of corrosion can be minimized further, in a manner that also improves the durability of the gasket. The invention can be employed instead of, or in addition to a double seal structure. Contrary to the usual objective of placing only similar materials in direct abutment across the gasket interface, the invention relies on a further conductive coating on the gasket sheath. The further conductive coating is made from a dispersion of conductive particles in a preferably-curable elastomeric binder. The binder prevents direct exposure of the metal components of the seal to environmental electrolytes, reduces abrasion which could wear away protective or similar-metal coatings on the corrosion-prone flange plates, for example of aluminum, and provides the necessary conductive connection. The corrosion resistant and conductive coating, however, has the further and unexpected benefit of substantially decreasing the flammability of the seal. Preferably, the sheath coating is a colloidal dispersion of conductive particles, especially a colloidal dispersion of carbon particles in a urethane-based flexible elastomeric binder.

Whereas the prior art has recommended doubling seals to isolate an EMI seal from environmental influences, the invention allows the seal to inherently exclude environmental influences (especially electrolytes), while retaining good conductive characteristics.

SUMMARY OF THE INVENTION

It is an object of the invention to lower the electrical resistance across a gasket interspersed between sealed flange plates.

It is also an object of the invention to exclude environmental electrolytes from dissimilar metals employed at the junction between conductively sealed flange plates.

It is a further object of the invention to improve the durability of conductive seals by decreasing the abrasion effects and flammability.

It is yet another object of the invention to reduce the expense and complexity of seals used to achieve a given degree of effectiveness in electromagnetic shielding.

These and other objects are accomplished by a conductive gasket for sealing facing flange plates against passage of electromagnetic and environmental effects having a conductive sheath, for example supported on a molded, resilient foam core, and structure for affixing the seal to conductive elements to be sealed. A conductive coating having suspended conductive particles in a nonreactive binder is applied externally to the sheath in order to reduce galvanic corrosion by isolating the dissimilar metals contained in the sealed elements and in the conductive sheath. The sheath coating is preferably applied as a dispersion of conductive particles in a flexible elastomeric binder, for example a colloidal dispersion of carbon particles in a urethane-based binder, to the entire outer surface of a metal plated sheath. The coating provides a low resistance, environmentally isolated junction between the sheath and the elements to be sealed, excluding environmental electrolytes, while improving abrasion resistance and flame retardant attributes of the seal.

BRIEF DESCRIPTION OF THE DRAWINGS

There is shown in the drawings the embodiments that are presently preferred. It should be understood, however, that the invention is not limited to the precise arrangements and instrumentalities shown in the drawings, wherein:

FIG. 6a is a perspective view of the cross-section of an embodiment of the seal at the conductive coating.

FIG. 6b is an elevation view showing the embedded mesh according to FIG. 6 a.

FIG. 7a a detailed cross-section from area 7 on FIG. 6, showing the surface structures.

FIG. 7b is a closer detail showing the conductive coating of the invention.

DETAILED DESCRIPTION OF THE PREFERRED EMBODIMENTS

The gasket of the invention serves a plurality of functions, having protective features including electromagnetic shielding, isolation from environmental infiltration and prevention of noise emission. This requires providing as continuous as possible an electrically conductive path across the gap defined between sealed flange plates. The body of the gasket is resilient, for example filled with a fire-retardant urethane foam. When compressed the gasket smoothly conforms to the surface of the sealed flange plates adjacent the gap.

Insofar as the seal of the invention can have a foam core, the core preferably defines an outer boundary layer enclosed by the electrically conductive sheath. The foam core and sheath of the seal are preferably joined by a continuous molding process wherein a foam core expands and cures in a traveling mold surrounded by a polyethylene or vinyl laminate sheath with a conductive surface and embedded metal fibers or the like to form a conductive path from the flange plates to the sheath surface. The sheath can have Monel or Ferrex metal fibers therein, or aluminum or silver can be used. The sheath can have an exposed wire mesh outside, but preferably is metallized by a sputtered-on or plated-on conductive coating, for example silver, applied to the outer side of the sheath by a diffusion technique prior to bonding the sheath to the foam core. The underlying structures of the core and sheath can be substantially as disclosed in U.S. patent application Ser. No. 181,834, filed Apr. 15, 1988 (now U.S. Pat. No. 4,857,668), the teachings which are hereby incorporated. This gasket requires only about a 25% compression to be highly effective, and is easily mounted using pressure sensitive adhesives, clip-on or fastener arrangements, or by use of a complementary shape of the seal such that the seal can be compressed into one or more slots in the flange plates. Preferably the foam core is formulated from a combustion-modified high resilience polyurethane.

Figure 1:
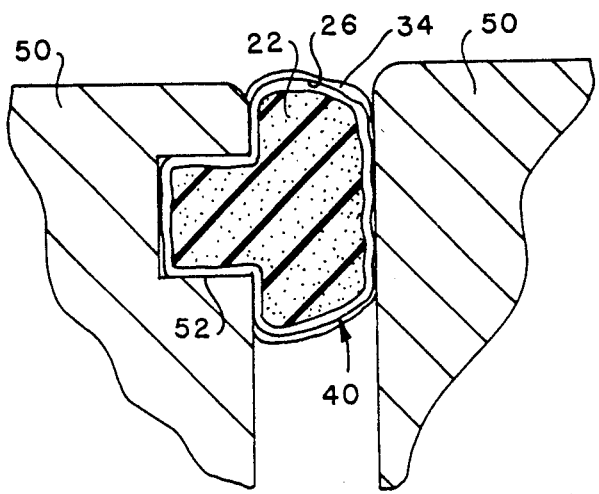
FIG. 1 is a cross sectional view of a slot-mounted conductive seal according to the invention.
Figure 2:
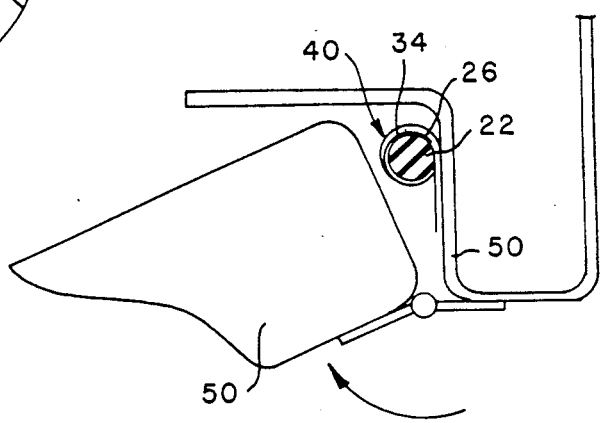
FIG. 2 is a section view illustrating mounting of the seal between facing flange plates.
Figure 3:
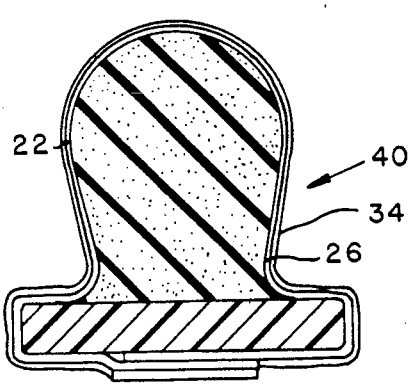
FIGS. 3-5 are section views illustrating alternative embodiments of the seal.
Figure 4:
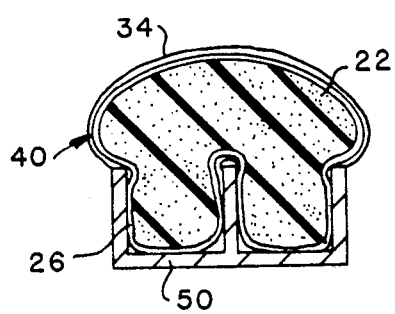
Figure 5:
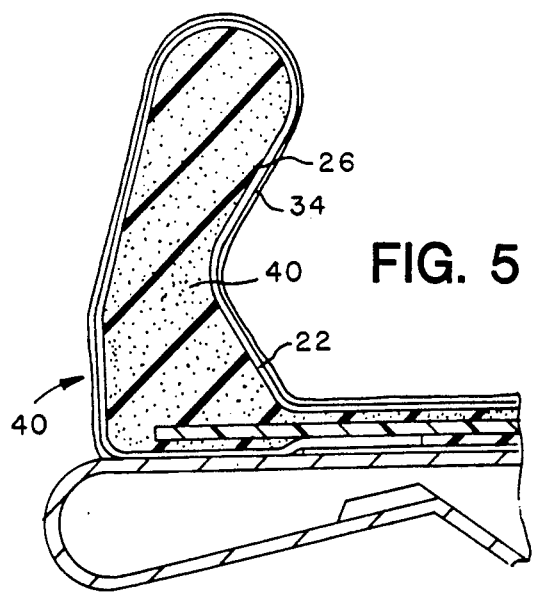

An embodiment invention is illustrated in FIG. 1. In order to electrically and environmentally bridge across the two facing flanges 50, seal strip 40 is maintained between them. In the embodiment of FIG. 1, the seal 40 is affixed to the respective flange plate by being compressed into a slot 52 of one of the facing flanges 50. It is also possible to employ other attachment techniques for affixing the seal strip 40 in position and some other possibilities are illustrated in FIGS. 3-5, namely magnets, double slot arrangements. spring clips, etc.

FIGS. 6-8 illustrate the respective layers of sheathing and coating applied to the foam core. Seal strip 40 has a central foam body 22, preferably a continuous molded polyurethane foam. This material can be compressed and relaxed many times without deterioration and thus effectively exerts a continuous outward pressure that causes the seal strip 40 to conform to the contour of the facing sealed flange 50, pressing the sheath into electrical contact with the facing flange plate and providing a hermetic seal, at least at relatively low differential pressures.

Foam body 22 is enclosed in a conductive sheath 26. Sheath 26 fully enclosing the foam core. the sheath presents a conductive bridge that produces an electrical connection across the flange plates, as needed to block electromagnetic radiation. There is some electrical resistance inherent in the embedded conductive material of the sheath, and additional resistance at the area of surface contact between the flange plates 50 and the conductive sheath 26. The resistance is preferably minimal, due to good surface contact between the respective conductive parts.

The sheath as noted above is preferably a metallized elastomer. The sheath can also be, for example, a metallized elastomer (e.g., metal filled, plated, laminated, etc.), Monel mesh, copper or light metallic sheet element, applied to the foam core when the core was first extruded and expanding. Plated and alloyed combinations are also possible for the mesh and/or other surface metal, for example. silver plated copper-filled elastomer, tin-plated beryllium-copper. tin plated copper clad steel mesh or silver plated aluminum filled elastomer.

The choice of a metal mesh sheath as opposed to a metal-containing elastomeric sheath must be made with consideration given for the extent of shielding needed and the possibility of corrosion of the flanges 50. The resistivity of a continuous body of metal is different than that of a metal-filled elastomer, by several orders of magnitude. Therefore, the choice of an elastomer will imply better resistance to corrosion (due to reduced current carrying for driving the galvanic action) but also deteriorated electro-magnetic shielding. The choice of a metal mesh, for example. has a much higher current carrying capacity but suffers from increased corrosive effects.

According to the invention, a metallized surface or foil as shown in the embodiment of FIGS. 7 and 8 is preferred for good current carrying and shielding capabilities. However, also according to the invention, a mesh or foil as shown in FIGS. 6a and 6b is coated with a surface coating that ameliorates the drawbacks of an exposed metal surface. The surface is protected from access by electrolytes while maintaining conductivity by means of an applied coating containing a dispersion of conductive particles in a binder. A colloidal dispersion of conductive particles provides a conductive path from the sheath surface to the surfaces of the facing flange plates, defined by numerous points of conductive contact between the conductive particles in the coating. The particles on the surfaces of the coating contact the sheath and the flange plate, respectively. Particles residing below the surfaces are embedded in the elastomer and thus protected from exposure to electrolytes. In this manner dissimilar metals can be used in the path between the flange plates, including sheath 26 and its coating 34. Environmental influences such as ambient salt spray or other electrolytes are thus isolated from the area at which corrosion is a greater problem. i.e., between the mesh and its coating.

The coating 34 according to the invention has the additional effect of resisting abrasion between the metal plated or mesh sheath 26 and the facing flange 50. In this manner, the possible deterioration of corrosion resistant surface coatings on flange 50 are better protected. A chromate conversion coating (e.g.. Iridite) can be used effectively on aluminum flange plates, and the coating of the invention very substantially reduces wear on the coating. As a result, the facing surfaces remain smooth and flat and seal strip 40 easily conforms to the surface.

Surprisingly, the colloidal dispersion according the invention also improves the seal by rendering it less flammable. The foam urethane core is preferably a combustion-modified foam that is not readily flammable. Elastomeric binders, as proposed for the sheath 26 and coating 34, however, are normally flammable. Nevertheless, test results show that the dispersion of conductive particles in an elastomeric binder as applied to the overall sheath has the effect of decreasing the flammability of the overall seal.

Coating 34 is a conductive particulate dispersion in an elastomeric binder, providing a corrosion inhibitor on metallic interfacing surfaces or gasketing used for EMI shielding for electronics and other materials that would otherwise be highly susceptible to galvanic corrosion in the presence of an aggravating electrolyte. The particles employed in the dispersion can be the same metals as in the flange plates, their platings, or the sheath 26. The particles can thus include, for example, flakes or fibers of nickel, aluminum, silver, etc. Preferably, the particles are carbon in the form of carbon black. The particles can also be other forms of carbon, for example graphite, ground as finely as practicable, and carried in an elastomeric binder. In a preferred embodiment, the carbon black is loaded in the elastomeric binder at a loading of about 25% to 40% by weight. Individual particles in the carbon black can be, for example, on the order of 25 to 75 microns ($10^{-6}$ meter) on a side.

The carbon or other conductive particles contained in the coating should be so small as to provide a colloidal (non-settling) dispersion in the particular binder used. A preferred binder is urethane-based elastomer, which is a solvent and resin mixture, applied in thickness comparable to paint to produce a flexible moisture-proof layer. Other possible binders for the conductive particles include acrylics, rubber formulations such as styrene butadiene rubber (SBR) or polyvinyl chloride (PVC), etc. In each case the binder is preferably provided at a viscosity comparable to paints, whereby application to the sheath material is conveniently accomplished using brushes, rollers or sprays.

Conductive colloidal particulate dispersion coatings such as carbon black in urethane binder, maintain a high electrical conductivity and thus achieve an appropriately high performance level of electromagnetic shielding, even when exposed to elevated temperatures or high humidity. Gaskets coated with the material maintain good electrical contact between the underlying highly conductive metal of the plated, mesh or foil sheath 26, with respect to the facing flange. Temperature ranges from −10 to +70 degrees C. are accommodated, notwithstanding the fact that temperature variations within this range are likely to produce condensation and collection of atmospheric electrolyte. In addition to seals formed between facing flange surfaces such as are defined by metallic cabinet components, it is also possible to use the coating of the invention on other surfaces having similar requirements. Conductive tape, cable shielding and even wall coverings can be coated to produce a surface which is resistant to corrosion, deterioration through oxidation from atmospheric exposure, and operable to shield against electromagnetic radiation or interference.

Whereas aluminum is a natural oxidizer which will produce a non-conductive oxide, thereby deteriorating the EMI/RFI shield, the colloidal coating according to the invention intends to inhibit oxidation on the aluminum surface, which improves electrical contact and shielding performance. Therefore, it is possible according to the invention to use untreated aluminum for the mating surfaces of panels and electrical components, that function as shielding elements.

The electrical conductivity of the gasket coating 34 will vary with the concentration of conductive particles in the binder. A relatively higher concentration improves conductivity and a relatively lower concentration improves corrosion resistance. It is presently preferred that the coating be prepared with sufficient concentration of conductive particles to produce about 0.5 to 1.0 ohm per cm, preferably 0.5 ohm per cm surface resistance. A coating of this description, using off-the-shelf carbon black in a urethane binder was applied to a gasket of silver plated rip-stop Nylon with a foamed urethane core, and its performance was compared to that of an uncoated gasket for abrasion effects and for flammability. The coated gasket provided good electromagnetic shielding, good abrasion resistance, and decreased flammability compared to the uncoated gasket.

A 6 mm by 6 mm gasket with a combustion-modified foam core and 30 denier uncoated sheath was subjected to the UL-94 flammability test, with the following results:

| UNCOATED SAMPLE | | | | | |
|---|---|---|---|---|---|
| Sample # | 1 | 2 | 3 | 4 | 5 |
| Duration of flame 1st ignition (sec.) | 4.4 | 3.3 | 2.2 | 7.1 | 2.9 |
| Duration of flame 2nd ignition | | 5.8 | 12.4 | 17.6 | 6.5 |
| Did specimen burn up to clamp? | no | no | no | no | no |
| Did flaming drips ignite the cotton? | yes | yes | no | yes | yes |

The same size gasket with a sheath coated with the colloidal carbon particle suspension of the preferred embodiment performed according to the following tables, the first table showing results with the sample in freshly made condition and the second table showing results for a sample that was "aged" at 70 degrees C., overnight:

| Sample # | 1 | 2 | 3 | 4 | 5 |
|---|---|---|---|---|---|
| COATED SAMPLE | | | | | |
| Duration of flame 1st ignition (sec.) | 0 | 0 | 0 | 0 | 0 |
| Duration of flame 2nd ignition | 3.7 | 0 | 4.4 | 0 | 1.7 |
| Did specimen burn up to clamp? | no | no | no | no | no |
| Did flaming drips ignite the cotton? | no | no | yes | no | no |
| AGED COATED SAMPLE | | | | | |
| Duration of flame 1st ignition (sec.) | 0 | 0 | 0 | 0 | 0 |
| Duration of flame 2nd ignition | 0 | 0 | 0 | 1.7 | 0 |
| Did specimen burn up to clamp? | no | no | no | no | no |
| Did flaming drips ignite the cotton? | no | no | yes | no | no |

Similarly favorable results were obtained in abrasion resistance. For this test, coated and uncoated gaskets were mounted on a wear tester (CSI - Stoll Quartermaster Universal Wear Tester, Model CS-22C) and cycled over a one inch stroke at 25 cycles per minute, using a bladder pressure of 3 psi and a 2 lb weight. Chromated steel plates were used as the abradent. The extent of abrasion was measured by measuring the average surface resistance and also by visually assessing the proportion of removed chromate coating, using a microscope.

| NUMBER OF CYCLES | % REMOVAL | SURFACE RESISTANCE |
|---|---|---|
| COATED SAMPLE | | |
| 0 | 0% | 0.5 OHM/SQUARE |
| 1,000 | 5 | 0.7 |
| 5,000 | 10 | 0.5 |
| 10,000 | 15 | 0.4 |
| 50,000 | 30 | 0.8 |
| 100,000 | 55 | 1.0 |
| UNCOATED SAMPLE | | |
| 0 | 0% | 0.5 OHM/SQUARE |
| 1,000 | 10 | 0.6 |
| 5,000 | 30 | 1.0 |
| 10,000 | 55 | 1.2 |
| 50,000 | 65 | 1.5 |
| 100,000 | 80 | 2.5 |

Abrasion greater than 60% can be equated with failure of the seal. According to the invention, a substantially improved service life was obtained, while retaining surface resistance within acceptable levels and with unexpected improvement in flammability characteristics. Insofar as flammability was improved, it is believed that the improvement results from covering the metallic plating on the sheath, which otherwise acted somewhat like a wick, to carry volatile materials to the surface and encourage burning.

The invention as disclosed is a sealing apparatus including first and second electrically conductive bodies 50 having conductive surfaces arranged to bear toward one another, a conductive seal 40 being disposed on at least one of the bodies and arranged to be interspersed between the bodies for shielding against passage of at least one of electromagnetic effects and environmental effects. A conductive coating 34 on the seal 40 includes a dispersion of conductive particles in a binder. Preferably, the particles are metal or carbon particles small enough to be carried in a colloidal suspension in the binder. The particles may be carbon particles about 25 to 75 microns in size, loaded in an elastomeric binder in a proportion of about 25% to 40% by weight. The sheath can for example, include at least one of aluminum, tin, copper, silver, gold, Monel and Ferrex. The sheath can be, for example, wire mesh or a foil, the sheath preferably being an elastomeric material with a plated-on or sputtered-on metallized layer or foil, for example of silver. The sheath can include a curable elastomer, silicone, neoprene or the like. A preferred sheath material is silver coated rip stop nylon.

The seal is normally applied to seal the bodies 50, normally including at least one of aluminum, nickel, steel, zinc and magnesium. The bodies 50 can include a metal covered by a surface treatment or plating, for example nickel on steel or aluminum, or a chromate conversion coating or a conductive organic coating. The colloidal dispersion preferably includes metallic particles and a flexible paint, for example a urethane-based paint. The metallic particles can be the same material as the sealed bodies 50, for example aluminum. The preferred conductive particles are carbon black, graphite and/or elemental metal nickel.

The invention also concerns a method of sealing electrically conductive bodies against electromagnetic and environmental effects while reducing corrosion. The method includes the steps of interspersing a conductive seal between the bodies 50, coating the conductive seal 40 with a conductive coating 34 having a dispersion of conductive particles, the coating being applied before or after interspersing the seal, at least on an area of the seal disposed against one of the bodies 50. The sheath 26 can include, for example, at least one of aluminum, tin, copper, silver, gold, Monel and Ferrex, and preferably is a wire mesh or metal foil. The sheath can include a curable elastomer, silicone, neoprene or the like, and can be formed from silver coated rip-stop nylon.

The bodies 50 to be sealed normally include at least one of aluminum, nickel, steel, zinc and magnesium. The bodies 50 can include a covering, for example a nickel plating, a chromate conversion coating or a conductive organic coating.

The apparatus of the invention is a gasket for blocking passage of electromagnetic and environmental effects between conductive bodies 50, comprising a continuous, molded, resilient foam core 22 in a flexible, electrically conductive and substantially abrasion resistant sheath 26, externally surrounding the foam core 22 and bonded to the foam core 22, the core filling the interior of the sheath. Means for attaching the gasket to at least one of the bodies are included, such that the resilient foam core presses the sheath against the bodies. A conductive coating is provided on the sheath, the coating being a colloidal dispersion of conductive particles.

The invention can also be characterized as an improved apparatus of the type having at least two conductive bodies and a resilient conductive gasket for blocking electromagnetic and environmental effects from passing the seal between the bodies, the gasket and the bodies together defining dissimilar metals subject to galvanic corrosion when exposed to an electrolyte, the improvement comprising a protective coating 34, applied to the gasket at least on a surface facing one of the bodies, the protective coating including a dispersion of conductive particles. Preferably, the coating is applied to the entire outside of the sheath 26, which can be a metal mesh, foil or the like. The preferred coating is carbon black in a urethane-based flexible binder.

The invention having been disclosed, additional embodiments will be apparent to persons skilled in the art. Reference should be made to the appended claims rather than the foregoing specification as indicating the true scope of the invention.

We claim:
1. An apparatus comprising:
   first and second electrically conductive bodies having conductive surfaces arranged to bear towards one another;
   a conductive seal body disposed on at least one of the electrically conductive bodies and arranged to be interspersed between the electrically conductive bodies for defining an electrically conductive path and shielding against passage of electromagnetic effects and environmental effects, the conductive seal body defining a highly conductive metal path of at least one of aluminum, nickel, tin, copper, silver, gold, copper clad steel, and an alloy including at least two of nickel, copper, iron and manganese, the highly conductive metal path disposed between the conductive surfaces of the first and second electrically conductive bodies; and, A sheath on the external surface of the conductive seal body formed by a protective conductive coating including a dispersion of conductive particles in a flexible elastomeric binder, the elastomeric binder including at least one of a curable elastomer, silicone, neoprene and nylon and the conductive particles being chosen from the group carbon black, graphite and elemental metal of size and density to provide a surface resistance in the coating of about 0.5 to 1.0 ohms per cm;

whereby the conductive particles complete a conductive path including the conductive seal body, the conductive path bridging between the electrically conductive bodies, and the elastomeric binder minimizes corrosion at the surfaces of the electrically conductive bodies.

2. The apparatus of claim 1, wherein the dispersion is a colloidal dispersion of the conductive particles and the elastomeric binder is an elastomeric paint.

3. The apparatus of claim 2, wherein the colloidal dispersion includes particles of carbon.

4. An apparatus comprising:

first and second electrically conductive bodies having surfaces arranged to bear towards one another;

a conductive seal disposed on at least one of the bodies and arranged to be interspersed between the bodies for shielding against passage of at least one of electromagnetic effects and environmental effects;

a sheath on the conductive seal, forming a conductive coating including a dispersion of conductive particles in a flexible elastomeric binder, and wherein the bodies include aluminum covered by at least one of a nickel coating, a chromate conversion coating and a conductive organic coating.

5. The apparatus of claim 4, wherein the conductive coating includes a paint chosen from a group consisting of urethane, acrylic, rubber and polyvinyl chloride based paint.

6. A method of sealing electrically conductive bodies against electromagnetic and environmental effects, while reducing corrosion, comprising the steps of:

interspersing a conductive seal between said bodies;

coating the conductive seal with a conductive coating having a dispersion of conductive particles, said coating being applied at least on an area of the seal disposed against one of said bodies, and, wherein the dispersion of conductive particles is made by mixing together carbon black and an elastomeric binder to provide a coating with a surface resistance of about 0.5 to 1.0 ohms per cm.

7. The apparatus of claim 6, wherein the elastomeric binder includes urethane.

8. A gasket for blocking passage of electromagnetic and environmental effects between conductive bodies, comprising:

a continuous, molded, resilient foam core in a flexible, electrically conductive and substantially abrasion resistant sheath externally surrounding the foam core and bonded to the foam core, the foam core filling the interior of the sheath;

means for attaching the gasket to at least one of the bodies such that the resilient foam core presses the sheath against at least one of the bodies, the sheath defining a highly conductive metal path of at least one of aluminum, nickel, tin, copper, silver, gold, copper clad steel, and an alloy including at least two of nickel, copper, iron and manganese; and, a conductive coating on the external surface of the sheath, the coating including a dispersion of conductive particles in an elastomeric binder including at least one of a curable elastomer, silicone, neoprene and nylon and the conductive particles being chosen from the group consisting of carbon black, graphite and elemental metal of size and density to provide a surface resistance in the coating of about 0.5 to 1.0 ohms per cm;

whereby the gasket blocks passage of electromagnetic and environmental effects while resisting abrasion and flame.

9. The gasket of claim 8, wherein the conductive coating is a colloidal dispersion of carbon black in a urethane binder.

10. An improved apparatus of the type having at least two conductive bodies and a resilient conductive gasket for blocking electromagnetic and environmental effects from passing between the bodies, the gasket and the bodies together defining dissimilar metals subject to galvanic corrosion when exposed to an electrolyte, the improvement comprising:

a protective coating applied to the gasket at least on an external surface of the gasket facing one of said bodies, the protective coating including a colloidal dispersion of conductive particles in an elastomeric binder, the protective coating having a surface resistance of about 0.5 to 1.0 ohms per cm;

whereby the protective coating provides electrical connection bridging between the gasket and the bodies while minimizing said galvanic corrosion.

11. The improved apparatus of claim 10, wherein the conductive particles are chosen from the group consisting of carbon black, graphite and elemental metal.

12. An improved apparatus of the type having at least two conductive bodies and a resilient conductive gasket for blocking electromagnetic and environmental effects from passing between the bodies, the gasket and the bodies together defining dissimilar metals subject to galvanic corrosion when exposed to an electrolyte, the improvement comprising:

a protective coating applied to the gasket at least on a surface facing one of said bodies, the protective coating including a colloidal dispersion of conductive particles, and wherein the conductive particles are about 25 to 75 microns in size and are loaded in an elastomeric binder to a proportion of about 25% to 40% by weight.

* * * * *